(12) United States Patent
Hellge et al.

(10) Patent No.: US 11,277,647 B2
(45) Date of Patent: Mar. 15, 2022

(54) FORWARD ERROR CORRECTION USING SOURCE BLOCKS WITH SYMBOLS FROM AT LEAST TWO DATASTREAMS WITH SYNCHRONIZED START SYMBOL IDENTIFIERS AMONG THE DATASTREAMS

(71) Applicant: Fraunhofer-Gesellschaft zur Foerderung der angewandten Forschung e.V., Munich (DE)

(72) Inventors: Cornelius Hellge, Berlin (DE); Thomas Schierl, Berlin (DE); Yago Sanchez, Berlin (DE); Manuel Hensel, Berlin (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/867,977

(22) Filed: May 6, 2020

(65) Prior Publication Data
US 2020/0267417 A1   Aug. 20, 2020

Related U.S. Application Data

(63) Continuation of application No. 16/131,078, filed on Sep. 14, 2018, now Pat. No. 10,681,387, which is a
(Continued)

(51) Int. Cl.
*H03M 13/03* (2006.01)
*H04N 19/30* (2014.01)
(Continued)

(52) U.S. Cl.
CPC ........ *H04N 19/89* (2014.11); *H03M 13/6522* (2013.01); *H04L 1/004* (2013.01);
(Continued)

(58) Field of Classification Search
CPC .............. H04N 19/89; H04N 21/2383; H04N 21/4382; H04N 19/29; H04N 19/39;
(Continued)

(56) References Cited

U.S. PATENT DOCUMENTS 6,112,085 A * 8/2000 Garner ................ H04W 12/062
                                                                 455/428
6,243,580 B1 * 6/2001 Garner ................... H04L 63/02
                                                                 455/428
(Continued)

FOREIGN PATENT DOCUMENTS

| CN | 101243664 A | 8/2008 |
| CN | 101729910 A | 6/2010 |

(Continued)

OTHER PUBLICATIONS

Official Communication issued in Chinese Patent Application No. 201810916164.7, dated Jun. 3, 2020.
(Continued)

*Primary Examiner* — Philip P. Dang
(74) *Attorney, Agent, or Firm* — Keating & Bennett, LLP

(57) ABSTRACT

A forward error correction (FEC) data generator has an input for at least two datastreams for which FEC data shall be generated in a joint manner, each datastream having a plurality of symbols. A FEC data symbol is based on a FEC source block possibly having a subset of symbols of the at least two data streams. The FEC data generator further has a signaling information generator configured to generate signaling information for the FEC data symbol regarding which symbols within the at least two datastreams belong to the corresponding source block by determining pointers to start symbols within a first and a second datastream, respectively, of the at least two datastreams and a number of symbols within the first datastream and second datastreams, respectively, that belong to the corresponding source block.

6 Claims, 7 Drawing Sheets

Related U.S. Application Data continuation of application No. 14/796,021, filed on Jul. 10, 2015, now Pat. No. 10,097,861, which is a continuation of application No. PCT/EP2014/050906, filed on Jan. 17, 2014.

(60) Provisional application No. 61/754,065, filed on Jan. 18, 2013.

(51) Int. Cl.

| | |
|---|---|
| H04N 19/65 | (2014.01) |
| H04N 19/89 | (2014.01) |
| H03M 13/00 | (2006.01) |
| H04L 7/00 | (2006.01) |
| H04L 1/00 | (2006.01) |
| H04N 21/2343 | (2011.01) |
| H04N 21/63 | (2011.01) |
| H04N 19/46 | (2014.01) |
| H04N 19/39 | (2014.01) |
| H04N 19/29 | (2014.01) |
| H04N 21/2383 | (2011.01) |
| H04N 21/438 | (2011.01) |
| H04N 19/70 | (2014.01) |

(52) U.S. Cl.
CPC .......... *H04L 1/0086* (2013.01); *H04L 7/0008* (2013.01); *H04N 19/29* (2014.11); *H04N 19/39* (2014.11); *H04N 19/46* (2014.11); *H04N 21/2383* (2013.01); *H04N 21/234327* (2013.01); *H04N 21/4382* (2013.01); *H04N 21/631* (2013.01); *H04N 19/70* (2014.11)

(58) Field of Classification Search
CPC ................ H04N 19/46; H04N 21/631; H04N 21/234327; H04N 19/07; H04L 1/0086; H04L 7/0008; H04L 1/004; H03M 13/6522

See application file for complete search history.

(56) References Cited

U.S. PATENT DOCUMENTS

| | | | | | |
|---|---|---|---|---|---|
| 6,385,647 | B1 * | 5/2002 | Willis | ............... | H04L 29/06 709/217 |
| 6,434,319 | B1 * | 8/2002 | Wine | ............... | H04N 5/783 386/230 |
| 6,640,145 | B2 * | 10/2003 | Hoffberg | ............ | G05B 19/426 700/17 |
| 6,851,086 | B2 * | 2/2005 | Szymanski | ......... | H03M 13/09 714/781 |
| 7,058,027 | B1 * | 6/2006 | Alessi | ............... | H04L 1/0007 370/310.1 |
| 7,124,064 | B1 * | 10/2006 | Thurston | ............ | G06F 30/30 703/2 |
| 7,136,710 | B1 * | 11/2006 | Hoffberg | ............ | H04N 21/252 700/83 |
| 7,280,615 | B2 | 10/2007 | Roberts | | |
| 7,403,569 | B2 * | 7/2008 | Redfern | ............ | H04L 27/2602 375/260 |
| 7,451,005 | B2 * | 11/2008 | Hoffberg | ............ | G05B 15/02 700/83 |
| 7,532,666 | B1 * | 5/2009 | Rezvani | ............ | H04L 1/0041 375/222 |
| 7,660,245 | B1 * | 2/2010 | Luby | ............... | H04L 1/0083 370/230 |
| 7,698,621 | B2 * | 4/2010 | Choi | ............... | H04L 1/0071 714/776 |
| 7,934,036 | B2 * | 4/2011 | Conti | ............... | G06F 13/24 710/261 |
| 7,974,714 | B2 * | 7/2011 | Hoffberg | ............ | H04N 7/163 700/94 |
| 8,005,167 | B2 * | 8/2011 | Lee | ............... | H04H 60/73 375/316 |
| 8,046,313 | B2 * | 10/2011 | Hoffberg | ............ | G06F 3/0482 706/14 |
| 8,085,878 | B2 * | 12/2011 | Choi | ............... | H04L 1/005 375/326 |
| 8,116,381 | B2 * | 2/2012 | Choi | ............... | H03M 13/27 375/240.25 |
| 8,199,830 | B2 * | 6/2012 | Lee | ............... | H04J 3/00 375/240.25 |
| 8,301,973 | B2 * | 10/2012 | Limberg | ............ | H03M 13/258 714/758 |
| 8,306,060 | B2 * | 11/2012 | Ngo | ............... | H04L 1/0072 370/473 |
| 8,310,976 | B2 * | 11/2012 | Lee | ............... | H04L 27/06 370/312 |
| 8,364,136 | B2 * | 1/2013 | Hoffberg | ............ | H04N 21/44222 455/418 |
| 8,627,091 | B2 * | 1/2014 | Dhuse | ............... | H04L 9/0894 713/176 |
| 9,553,912 | B2 * | 1/2017 | Bae | ............... | H04N 21/643 |
| 9,961,412 | B2 * | 5/2018 | Barrett | ............... | H04W 72/005 |
| 2006/0200253 | A1 * | 9/2006 | Hoffberg | ............ | G05B 15/02 700/19 |
| 2006/0280254 | A1 | 12/2006 | Luby et al. | | |
| 2007/0033494 | A1 | 2/2007 | Wenger et al. | | |
| 2007/0081586 | A1 * | 4/2007 | Raveendran | ............ | H04N 19/40 375/240.1 |
| 2007/0204196 | A1 * | 8/2007 | Watson | ............... | H04L 1/0083 714/751 |
| 2009/0049347 | A1 * | 2/2009 | Shridhar | ............ | H04L 27/2647 714/704 |
| 2009/0074079 | A1 * | 3/2009 | Lee | ............... | H04L 1/0047 375/240.25 |
| 2011/0093759 | A1 * | 4/2011 | Song | ............... | H04L 1/0042 714/756 |
| 2011/0099449 | A1 | 4/2011 | Li et al. | | |
| 2011/0202270 | A1 * | 8/2011 | Sharma | ............ | G06Q 30/0241 701/533 |
| 2011/0216841 | A1 * | 9/2011 | Luby | ............... | H03M 13/373 375/260 |
| 2011/0299448 | A1 * | 12/2011 | Meier | ............... | H04N 21/4402 370/312 |
| 2011/0320905 | A1 * | 12/2011 | Lin | ............... | H04L 1/0041 714/752 |
| 2012/0131407 | A1 * | 5/2012 | Chiao | ............... | H04N 19/187 714/751 |
| 2012/0155349 | A1 * | 6/2012 | Bajic | ............... | H04L 69/32 370/311 |
| 2012/0307159 | A1 * | 12/2012 | Ouchi | ............... | H04N 21/2381 348/723 |
| 2013/0136193 | A1 * | 5/2013 | Hwang | ............... | H04L 65/80 375/240.27 |
| 2013/0263201 | A1 * | 10/2013 | Chung-How | ............ | H04N 19/89 725/116 |

FOREIGN PATENT DOCUMENTS

| | | |
|---|---|---|
| CN | 101855855 A | 10/2010 |
| CN | 101946509 A | 1/2011 |
| CN | 102510292 A | 6/2012 |
| EP | 1 293 059 B1 | 3/2004 |
| WO | 2008/106317 A1 | 9/2008 |
| WO | 2009/075537 A2 | 6/2009 |

OTHER PUBLICATIONS

Hellge et al., "Forward Error Correction Using Source Blocks With Symbols From at Least Two Datastreams With Synchronized Start Symbol Identifiers Among the Datastreams ", U.S. Appl. No. 16/131,078, filed Sep. 14, 2018.

Official Communication issued in corresponding Chinese Patent Application No. 201810916164.7, dated Mar. 31, 2021.

(56) References Cited

OTHER PUBLICATIONS

Zhang, "Telecommunications Technology-Forward Error Correction Technology of OTN ", Telecommunications Technology, Apr. 25, 2011, 4 pages.

Official Communication issued in corresponding Chinese Patent Application No. 201810916496.5, dated Dec. 2, 2021.

* cited by examiner

FORWARD ERROR CORRECTION USING SOURCE BLOCKS WITH SYMBOLS FROM AT LEAST TWO DATASTREAMS WITH SYNCHRONIZED START SYMBOL IDENTIFIERS AMONG THE DATASTREAMS

CROSS-REFERENCE TO RELATED APPLICATIONS

This application is a continuation of copending U.S. patent application Ser. No. 16/131,078, filed on Sep. 14, 2018, which is a continuation of U.S. patent application Ser. No. 14/796,021, filed on Jul. 10, 2015, which is a continuation of copending International Application No. PCT/EP2014/050906, filed Jan. 17, 2014, which is incorporated herein by reference in its entirety, and additionally claims priority from U.S. Provisional Application No. 61/754,065, filed Jan. 18, 2013, which is also incorporated herein by reference in its entirety.

BACKGROUND OF THE INVENTION

The present invention relates generally to the transmission, broadcasting, and/or storage of information and/or data. More particularly, the present invention relates to forward error correction of the data to be transmitted, broadcasted, and/or stored. Some embodiments according to the present invention relate to a forward error correction data generator. Some embodiments of the present invention relate to a forward error correction decoder. Some embodiments relate to a method for generating forward error correction data. Further embodiments relate to a method for forward error correction decoding. Some aspects of the present invention relate to the reconstruction of FEC (forward error correction) source blocks with synchronization SI (symbol ID).

Video coding techniques are nowadays still investigated in order to support, for example, increasing spatial resolutions (e.g. UHD, ultra high definition). Other research interest are the reduction of data to be transmitted and/or an optimization of the coding efficiency, in particular for mobile applications. Among the available video coding standards, H.264/MPEG-4 AVC standard is probably the most widely used with more than 1 billion devices.

Since the introduction of the H.264/MPEG-4 AVC standard in 2003, several extension to the base standard have been successfully launched, for example the Scalable Video Coding amendment (SVC) and the Multiview Video Coding amendment (MVC) of the H.264/AVC standard.

The Scalable Video Coding amendment (SVC) of the H.264/AVC standard provides network-friendly scalability at a bit stream level with a moderate increase in decoder complexity relative to single-layer H.264/AVC. It supports functionalities such as bit rate, format, and power adaptation, graceful degradation in lossy transmission environments as well as lossless rewriting of quality-scalable SVC bit streams to single-layer H.264/AVC bit streams. These functionalities provide enhancements to transmission and storage applications. SVC has achieved significant improvements in coding efficiency with an increased degree of supported scalability relative to the scalable profiles of prior video coding standards.

The Multiview Video Coding amendment (MVC) of the H.264/AVC standard provides view scalability at the bitstream level. This allows the efficient transmission of multiview video (e.g., video with 2 views suitable for viewing on a stereo display) in an efficient and backward compatible way. A legacy H.264/AVC decoder decodes only one (the so-called base view) of the two views that are included in the multiview bitstream. The reconstructed video sequence can be displayed on a conventional 2d display. On the contrary, a stereo decoder is capable of decoding both views and the decoded video sequences (one for the left and one for the right eye) are suitable for 3d displays.

Both SVC and MVC can be considered as examples of so called layered media coding technologies which generate video bit-streams with various media layers, each of them representing another level of quality. Due to inter-layer prediction there exist hierarchies between these media layers, where media layers depend on other media layers for successful decoding. Layer-Aware Forward Error Correction (LA-FEC) exploits the knowledge of the existing dependency structures within layered media streams. LA-FEC generates FEC data so that protection of less important media layers can be used with protection data of more important media layers for joint error correction. In this way, LA-FEC enables new functionalities and increases the protection of more important media without increasing the total amount of data.

In order to correct errors in received data at a receiver side of a transmission channel by employing Layer-Aware Forward Error Correction, a FEC decoder necessitates knowledge about the correspondence between a given portion of payload data and the portion of FEC parity data that can be used for correcting errors (e.g., transmission errors) in said portion of payload data. In other words, the FEC decoder has to be able to establish a link between the portion of payload data and the corresponding portion of FEC parity data, in order to successfully correct errors in the payload data and/or the FEC parity data. This aspect becomes in particular important when the base representation, the enhancement representation, and the FEC parity information are transmitted using different data flows or streams. Another possibly scenario in which the correspondences between payload data and FEC parity data might not be straight forward is when the payload data and the FEC parity data are transmitted via packet-switched network so that each packet can take different routes and arrive at different times at the receiver.

Efficient and/or robust signaling of correspondence between FEC parity data and payload data is therefore desirable for improving error correction capabilities and/or error correction efficiency, among others.

SUMMARY

According to an embodiment, a forward error correction data generator may have: an input for at least two datastreams for which forward error correction data shall be generated in a joint manner, each datastream having a plurality of symbols, wherein a forward error correction data symbol is based on a forward error correction (FEC) source block; a signaling information generator configured to generate signaling information for the forward error correction data symbol regarding which symbols within the at least two datastreams belong to the corresponding FEC source block by determining a pointer to a start symbol within a first datastream of the at least two datastreams, a pointer to a start symbol within a second datastream of the at least two datastreams, a number of symbols within the first datastream that belong to the corresponding source block, and a number of symbols within the second datastream that belong to the corresponding source block; and a synchronizer configured to determine a common identifier for the start symbols within the at least two datastreams, wherein the signaling information generator is configured to include the common identifier into the signaling information to serve as the pointer to the start symbols within the at least two datastreams.

According to another embodiment, a forward error correction decoder may have: an input configured to receive a repair stream having repair symbols relative to at least two received datastreams to be forward error corrected; a signaling information analyzer configured to analyze a signaling information within a repair symbol or linked therewith, the signaling information having a pointer to a start symbol within at least one datastream of the at least two datastreams, a number of symbols within the first datastream that belong to the corresponding source block, and a number of symbols within the second datastream that belong to the corresponding source block; and a source block collector configured to collect symbols within the at least two datastreams belonging to a current source block using the signaling information, wherein the pointer to the start symbol within at least one datastream is a common identifier for the start symbols within the at least two datastreams, and wherein the source block collector is further configured to collect the number of symbols within the first datastream starting at the first start symbol indicated by the common identifier, and to collect the number of symbols within the second datastream starting at the second start symbol equally indicated by the common identifier.

According to another embodiment, a method for generating forward error correction data may have the steps of: receiving at least two datastreams for which forward error correction data shall be generated in a joint manner, each datastream having a plurality of symbols, wherein a forward error correction data symbol is based on a forward error correction (FEC) source block possibly having a subset of symbols of the at least two data streams; and generating signaling information for the forward error correction data symbol regarding which symbols within the at least two datastreams belong to the corresponding source block by determining a pointer to a start symbol within a first datastream of the at least two datastreams, a pointer to a start symbol within a second datastream of the at least two datastreams, a number of symbols within the first datastream that belong to the corresponding source block, and a number of symbols within the second datastream that belong to the corresponding source block; determining a common identifier for the start symbols within the at least two datastreams, wherein generating the signaling information further has including the common identifier into the signaling information to serve as the pointer to the start symbols within the at least two datastreams.

According to still another embodiment, a method for forward error correction decoding may have the steps of: receiving at least one repair stream having repair symbols relative to at least two received datastreams to be forward error corrected; analyzing a signaling information within a repair symbol or linked therewith, the signaling information having a pointer to a start symbol within at least one datastream of the at least two datastreams, a number of symbols within the first datastream that belong to the corresponding source block, and a number of symbols within the second datastream that belong to the corresponding source block; and collecting symbols within the at least two datastreams belonging to a current source block using the signaling information, wherein the pointer to the start symbol within at least one datastream is a common identifier for the start symbols within the at least two datastreams, and wherein collecting the symbols further has collecting the number of symbols within the first datastream starting at the first start symbol indicated by the common identifier, and to collect the number of symbols within the second datastream starting at the second start symbol equally indicated by the common identifier.

Another embodiment may have a computer program for implementing the methods mentioned above when being executed on a computer or signal processor.

A forward error correction data generator is provided. The forward error correction data generator comprises an input for at least two datastreams for which forward error correction data shall be generated in a joint manner, each datastream comprising a plurality of symbols, wherein a forward error correction data symbol is based on a forward error correction (FEC) source block possibly comprising a subset of symbols of the at least two data streams. The forward error correction data generator further comprises a signaling information generator configured to generate signaling information for the forward error correction symbol regarding which symbols within the at least two datastreams belong to the corresponding source block by determining a pointer to a start symbol within a first datastream of the at least two datastreams, a pointer to a start symbol within a second datastream of the at least two datastreams, a number of symbols within the first datastream that belong to the corresponding source block, and a number of symbols within the second datastream that belong to the corresponding source block.

Embodiments provide a forward error correction decoder comprising an input configured to receive a repair stream comprising repair symbols relative to at least two received datastreams to be forward error corrected. The forward error correction decoder further comprises a signaling information analyzer configured to analyze a signaling information within a repair symbol or linked therewith. The signaling information comprises a pointer to a start symbol within at least one of the at least two datastreams, a number of symbols within the first datastream that belong to the corresponding source block, and a number of symbols within the second datastream that belong to the corresponding source block. The forward error correction decoder further comprises a source block collector configured to collect symbols within the at least two datastreams belonging to a current source block using the signaling information.

Furthermore, a method for generating forward error correction data is provided. The method comprises receiving at least two datastreams for which forward error correction data shall be generated in a joint manner. Each datastream comprises a plurality of symbols. A forward error correction data symbol is based on a forward error correction (FEC) source block possibly comprising a subset of symbols of the at least two data streams. The method further comprises generating signaling information for the forward error correction symbol regarding which symbols within the at least two datastreams belong to the corresponding source block. In particular, the signaling information is generated by determining a pointer to a start symbol within a first datastream of the at least two datastreams, a pointer to a start symbol within a second datastream of the at least two datastreams, a number of symbols within the first datastream that belong to the corresponding source block, and a number of symbols within the second datastream that belong to the corresponding source block.

With respect to a decoding aspect, a method for forward error correction decoding is also provided. The method comprises receiving at least one repair stream comprising repair symbols relative to at least two received datastreams to be forward error corrected. The method also comprises analyzing a signaling information within a repair symbol or linked therewith. The signaling information comprises a pointer to a start symbol within at least one of the at least two datastreams, a number of symbols within the first datastream that belong to the corresponding source block, and a number of symbols within the second datastream that belong to the corresponding source block. The method further comprises collecting symbols within the at least two datastreams belonging to a current source block using the signaling information.

Moreover, a computer program for implementing at least one of the above-described methods when being executed on a computer or signal processor is provided.

BRIEF DESCRIPTION OF THE DRAWINGS

In the following, embodiments of the present invention are described in more detail with reference to the figures, in which.

DETAILED DESCRIPTION OF THE INVENTION

Forward error correction (FEC) or channel coding is a technique that can be used for correcting errors in data transmission over unreliable or noisy communication channels. To this end, a certain amount of redundancy is added to the original message at a transmitter end of the channel by using an error correcting code (ECC). As long as only a limited number of errors occur anywhere in the message, the receiver is capable of detecting the errors, due to the added redundancy. Often, it is even possible to correct these errors without retransmission. Accordingly, no reverse channel is needed to request retransmission of data. However, the ability to correct errors comes at the cost of a fixed, higher forward channel bandwidth. FEC is therefore typically applied in situations where retransmissions are costly or impossible, such as one-way communication links and when transmitting to multiple receivers in multicast. Another application of FEC is related to mass storage devices to enable recovery of corrupted data.

Many different error correcting codes are available for implementing a forward error correction scheme. Examples of possible error correcting codes are: BCH code, Hadamard code, Hamming code, Low Density Parity Check (LDPC) code, Raptor code, Reed-Solomon error correction, Reed-Muller code, Turbo code, and Walsh-Hadamard code.

Figure 1:
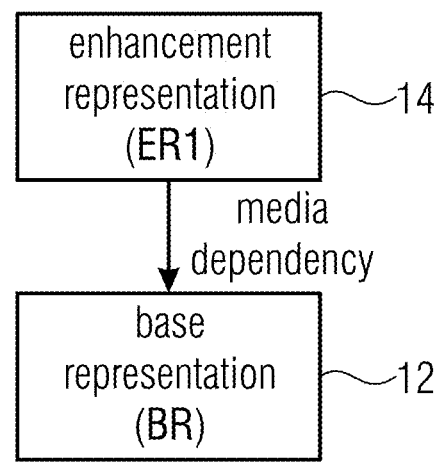
FIG. 1 schematically illustrates an example of the structure of layered coded media.

Layer-Aware FEC (LA-FEC) is an FEC scheme specific for layered media data, which exploits the dependency across layers of the media for FEC construction. FIG. 1 illustrates how LA-FEC is applied to layered coded media data, such as content encoded by Scalable Video Coding (SVC) or Multi-view Video Coding (MVC) or the scalable extension of HEVC (SHVC). In the example shown, there is a base representation (BR) 12 (e.g. base resolution or left view) that is independently decodable and one additive enhancement representation (ER1) 14 (e.g. enhancement resolution or right view) with dependency on the base representation. Note that the number of representations and the dependency structure depends on the media encoding and can differ from the given example.

The base representation 12 can be regarded as a base layer/representation (BL/BR) representing the base quality, which is in both cases, SVC and MVC, a video stream with a resolution of, e.g., 720p. An additional integration of the enhancement layer/represen-tation (EL/ER) in the decoding process improves the video quality. With SVC, the quality increases to a resolution of 1080p. With MVC, decoding of the EL (or ER) adds a second view for 3D television. As shown in FIG. 1, there are dependencies between the media layers. The base layer/representation BL (or BR) can be decoded independently from other media layers while the enhancement layer/representation EL (or ER) needs the BL (or BR) for error-free decoding. Although the forward error correction data generator is described in a context of layered media coding technologies such as SVC or MVC, the proposed concept for signaling information for forward error correction can be employed in different environments, as well. For example, one of the datastreams could comprise a video track and another datastream could comprise a corresponding audio track. Another example could be several audio signals, such as used for 5.1 surround sound multi-channel audio systems. Furthermore, it may even be possible that the at least two datastreams (or their contents) are not related to each other but rather independent from each other. A possible example could be two independent television programs that are broadcasted via the same channel (e.g., via satellite).

Figure 2:
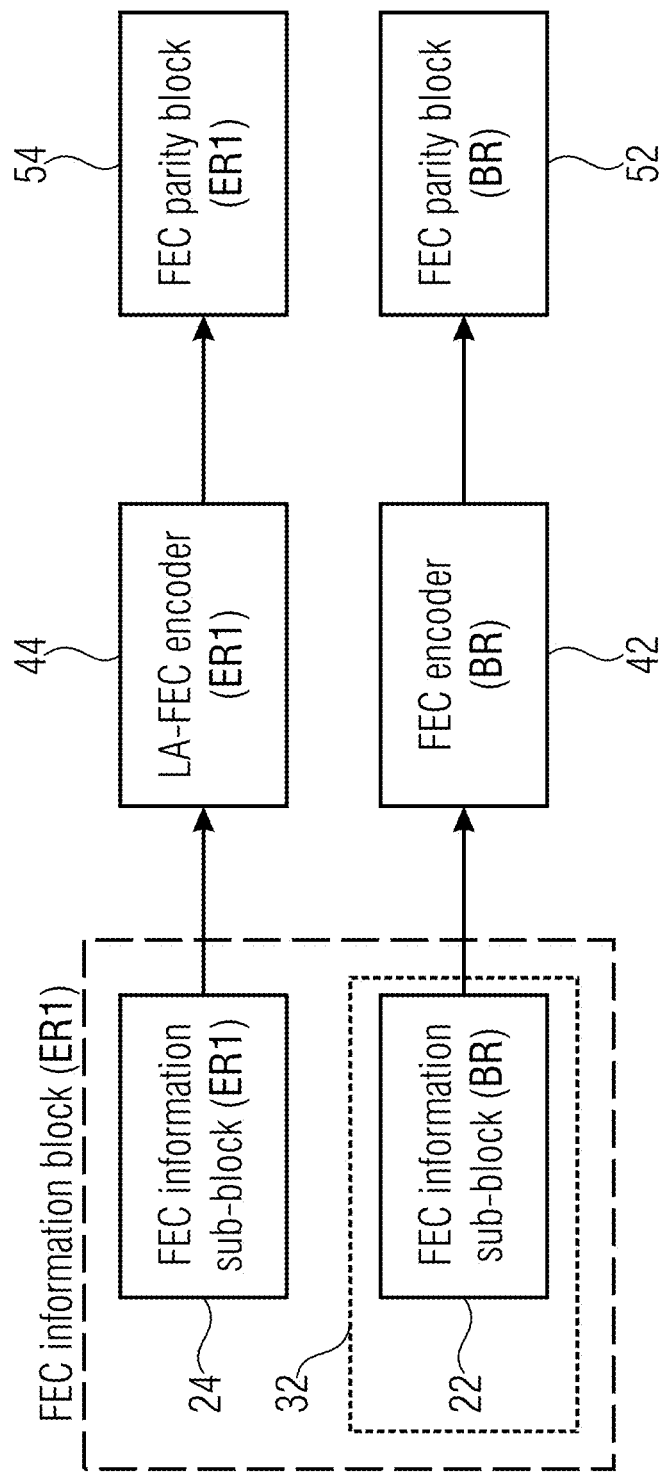
FIG. 2 schematically illustrates a concept for FEC data generation with LA-FEC.

For LA-FEC, an FEC information block of a certain representation consists of multiple FEC information sub-blocks, one for the representation itself and one for each Complimentary Representation of this representation. Each of these FEC information sub-blocks is generated only from data from one representation. An exemplary illustration of the LA-FEC generation for the layered coded media structure example is shown in FIG. 2. Since the Base Representation (BR) is independent from any other representations, its FEC information block 32 only contains the FEC information sub-block 22 of BR, whereas the FEC information block 34 of the Enhancement Representation (ER1) consists of the same FEC information sub-block 22 of BR and the FEC information sub-block 24 of ER1.

FIG. 2 further shows a LA-FEC encoder 42 for encoding the FEC information block 32 of the base representation, and more particularly for generating a FEC parity block 52 for the base representation. A further LA-FEC encoder 44 is provided for encoding the FEC information block 34 of the enhancement representation, and more particularly for generating a FEC parity block 54 for the enhancement representation. The two LA-FEC encoders 52, 54 may be combined as a single LA-FEC encoder.

With LA-FEC, an FEC parity block of Dependent Representations (in the example ER1) additionally protects all data of all its Complimentary Representations (in the example BR). Hence, a given representation can be recovered by using FEC packet block generated by its corresponding FEC information block, generated by the FEC information blocks from representations that depend on it, or by using all FEC parity blocks of Dependent Representations and all its Complimentary Representations in a joint decoding process.

For instance, if a receiving entity receives the base representation BR only, it can decode and correct that representation by using FEC packet block 52 (BR). If a receiving entity receives BR and ER1, it is able to decode and correct BR with FEC packet block 52 (BR), FEC packet block 54 (ER1), or both FEC packet block 52 (BR) and FEC packet block 54 (ER1) in a joint decoding process. Thereby, LA-FEC allows for enhancing the robustness of layered coded media. More concretely, in the situation that the BR cannot be corrected by FEC packet block (BR), the receiving entity with LA-FEC can try to correct BR by FEC packet block (ER1), or by joint decoding of both FEC packet block (BR) and FEC packet block (ER1).

Method 1: Reconstruction of FEC Source Blocks:

Reconstruction of a source block from received symbols necessitates the knowledge which source symbols are part of the FEC source block. With LA-FEC, it is in addition necessitated to link FEC source blocks (SBs) of base and enhancement layer, since enhancement layer FEC data is generated over the data of both layers.

Figure 3:
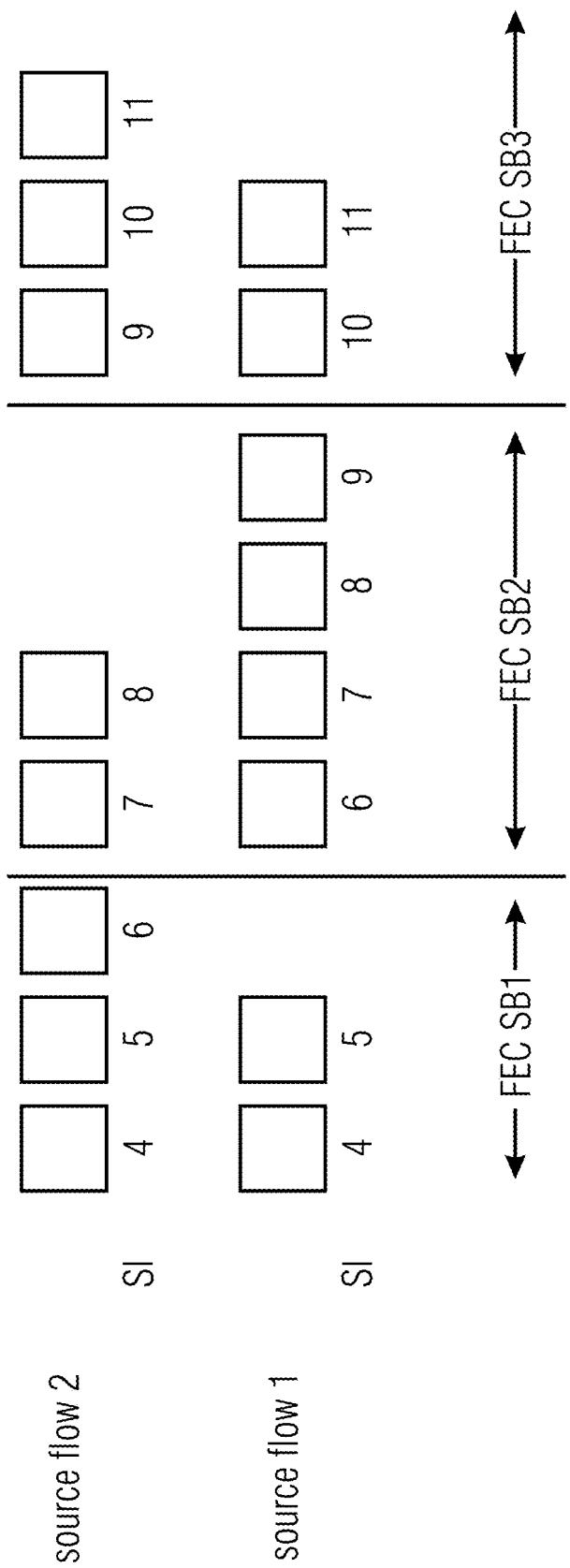
FIG. 3 schematically illustrates a first method wherein two source flows have independent symbol identifiers (SI)

According to a first possible signaling method it is proposed to have an incremental ID for each source symbol, in the following referred to as symbol ID (SI). With such an approach, the symbol ID is independent for each layer as shown in FIG. 3. Hence, FIG. 3 schematically shows independent SI for two source flows.

The method for signaling of LA-FEC as schematically illustrated in FIG. 3 works as described in the following signaling for repair symbols for associating repair symbols to source symbols of different flows.

Base Layer/Enhancement Layer

FEC Source ID: [SI]
Base layer FEC Repair ID: [Start SI of FEC SB; length;]
Enhancement layer FEC Repair ID: [Start SI of FEC SB; length; Start SI of FEC SB (Base); length (Base)]

E.g. an exemplary signaling for the source and repair symbols (2 symbols) of FEC SB2 in FIG. 3 with the method in FIG. 1, with [ ] denoting signaling of one packet, would be:

| Source (base): | [6] [7] [8] [9] | Source (enh): | [7] [8] |
| Repair (base): | [6; 4][6; 4] | Repair (enh): | [7; 2; 6; 4][7; 2; 6; 4] |

Note that in the above example the signaling [7;2;6;4] of the repair symbols indicates that this repair symbol is related to two symbols in the enhancement layer, starting with Symbol ID 7 in source flow 2, and also to four symbols in the base layer, starting with Symbol ID 6 in source flow 1. Source flow 1 contains the base representation. Source flow 2 contains the enhancement representation. In the above example, the signaling information related to the base representation is in bold face.

Method 2: Reconstruction of FEC Source Blocks with Synchronization ID:

Another possible method for signaling enables a reconstruction of FEC source blocks with synchronization SI (Symbol ID). This signaling method is schematically shown in FIG. 4 which illustrates a synchronization point for FEC SBs with synchronized starting SI per FEC source block (FEC SB).

Figure 4:
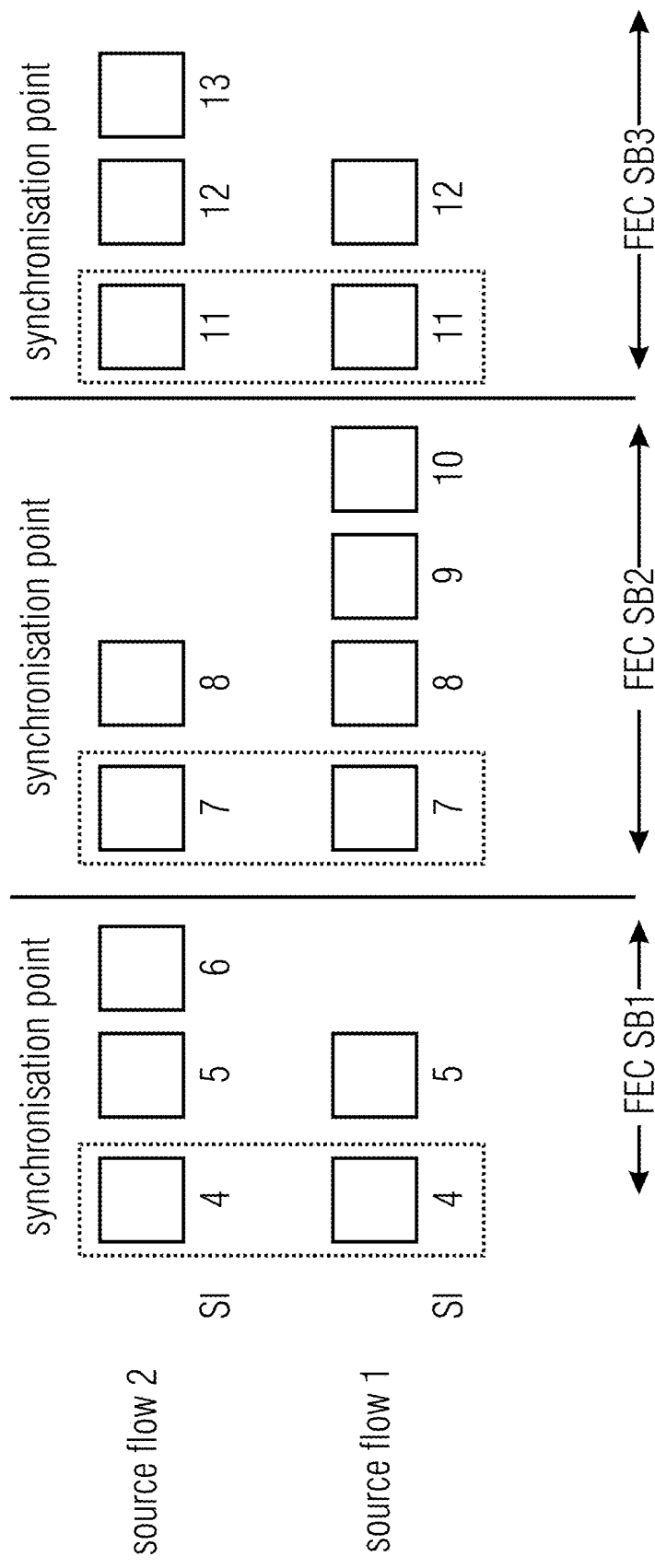
FIG. 4 schematically illustrates a second method according to which synchronization points for FEC source blocks are provided with synchronized SI per FEC source block.

With the signaling method according to FIG. 4, the following signaling for repair symbols is necessitated to associate repair symbols to source symbols:

Source flow ½ FEC Source ID: [SI]
Source flow 1 FEC Repair ID: [Start SI of FEC SB; length;]
Source flow 2 FEC Repair ID: [Start SI of FEC SB; length; length (base)]

E.g. an exemplary signaling for the source and repair symbols (2 symbols) of FEC SB2 in FIG. 4 with the second method, with [ ] denoting signaling information of one packet, would be:

| Source flow 1: | [7] [8] [9] [10] | Source flow 2: | [7] [8] |
| Repair flow 1: | [7; 4][7; 4] | Repair flow 2: | [7; 2; 4][7; 2; 4] |

Note that in the embodiment of FIG. 4 and in related embodiments the "Start SI of FEC SB" is valid for both the base representation (source flow 1) and the enhancement representation (source flow 2).

Figure 5:
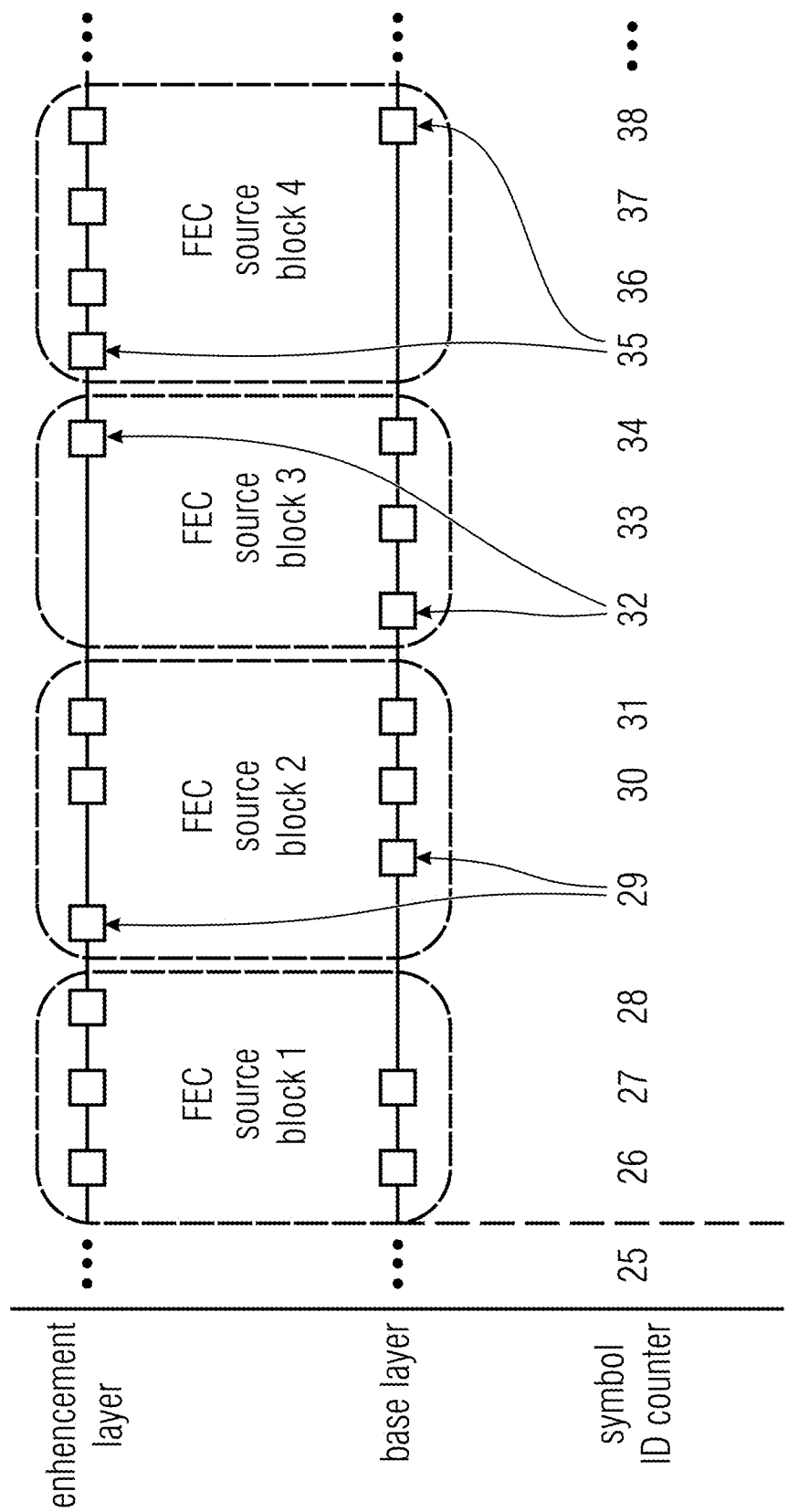
FIG. 5 schematically illustrates how symbols within a first datastream and a second datastream may be grouped or collected for the purpose of LA-FEC.

FIG. 5 illustrates schematically how symbols within a first datastream (in this example relative to an enhancement layer) and a second datastream (here relative to a base layer) may be grouped or collected for the purpose of layer aware FEC. Each symbol is schematically represented by a small square. For example, the first FEC source block (FEC source block 1) takes into account three symbols from the enhancement layer datastream (first datastream) and two symbols from the base layer datastream (second datastream—or vice versa). Note that the base layer could be additionally protected by a further, base layer-dedicated FEC. Such a base layer-dedicated FEC may be useful, for example, in situations in which only the datastream carrying the base layer can be reliably received, whereas the datastream carrying the enhancement layer is not received (e.g., for reasons of bandwidth limitations, etc.).

The symbol counter has an initial counter value of 25 (chosen arbitrarily, might be any other number). Therefore, the start symbols for the first and second datastreams in FEC source block receive the next number, here 26. Depending on whether there are more symbols for the currently considered FEC source block in the first datastream or the second datastream, the start symbol for the next FEC source block is incremented by this number, i.e., by the maximum number of symbols within one of the datastreams that contribute to the FEC source block. In the present case, the FEC source block 1 comprises three symbols in the enhancement layer and two symbols in the base layer. Hence, the maximum number of symbols per datastream is three for FEC source block 1. Therefore, the start symbols in the second FEC source block (FEC source block 2) are referenced by the number or index "29". Note that in FIG. 5 the start symbols in FEC source block 2 are not aligned (that is, a payload data encoder or decoder would have to consider different presentation times of these symbols)—however, this does not affect the FEC scheme, because all that the FEC encoder or FEC decoder needs to know is: Which symbol within a datastream is the first symbol (i.e. the start symbol) for a given FEC source block (i.e., #29 in both the first and second datastreams), and how many symbols from this datastream have to be considered in total for the given FEC source block (i.e., for FEC source block 2: 3 symbols in the first datastream and 3 symbols in the second datastream).

Figure 6:
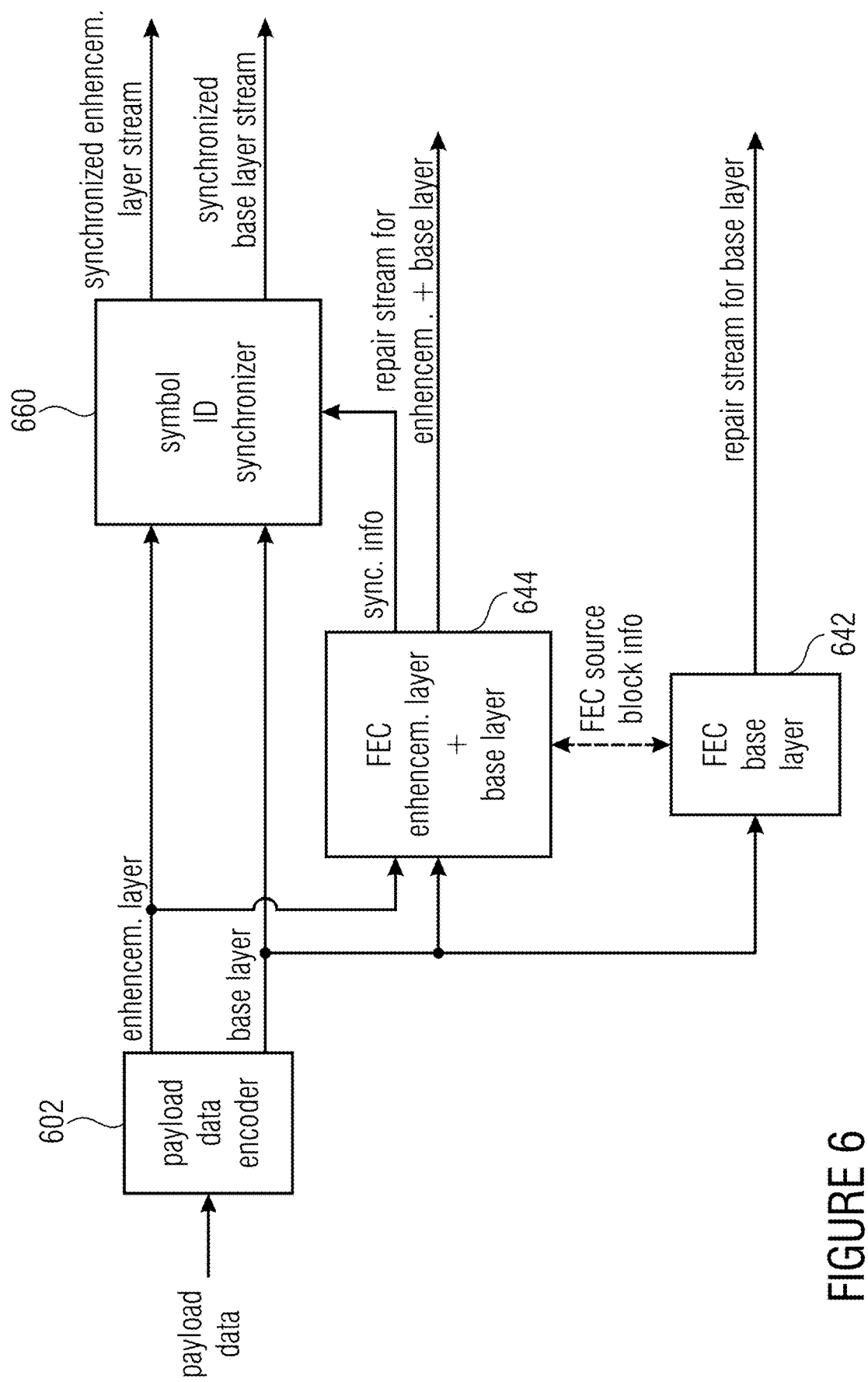
FIG. 6 shows a schematic block diagram illustrating how the datastreams may be processed at an encoder side.

FIG. 6 shows a schematic block diagram illustrating how the datastreams may be processed at an encoder side. In particular, the illustrated symbol ID synchronizer may modify the first and second datastreams by adding information about the synchronization of the at least two datastreams useful for FEC according to the above mentioned method of FIG. 4.

The encoder side arrangement as schematically shown in FIG. 6 comprises a payload data encoder 602, a forward error correction data generator 644, and a symbol ID synchronizer 660. A further forward error correction data generator 642 is also provided, this further forward error correction data generator 642 being optional, however. Before describing in more detail the functionality of the forward error correction data generator 644, which represents possible embodiments of the present invention, we first describe the framework of the encoder side arrangement as schematically shown in FIG. 6.

The purpose of the encoder side arrangement is to encode payload data and prepare the encoded payload data for transmission over a channel or network. To this end, the encoded payload data is used to form a datastream (or source flow) or several datastreams (or source flows). For example, the payload data may be video data, possibly including an audio track. Other types of payload data are also possible and not excluded. The payload data is received at a payload data encoder 602 which may encoded the payload data using a lossy video coding method, for example, such as H.264/MPEG-AVC. Moreover, the payload data encoder 602 is configured to provide two datastreams of encoded payload data: a first datastream for a base layer (base representation) and a second data stream for an enhancement layer (enhancement representation). In alternative implementations, the payload data encoder may be configured to provide a plurality of datastreams (more than two) for different layers of enhancement. For example, the payload data encoder 602 may be a SVC (Scalable Video Coding) encoder or a MVC (Multiview Video Coding) encoder.

We now consider the FEC data generator 644 which receives both datastreams, i.e., the base layer datastream and the enhancement layer datastream. To this end, the FEC data generator 644 comprises an input for at least two datastreams for which forward error correction data shall be generated in a joint manner. Each datastream comprises a plurality of symbols. A forward error correction data symbol is based on a forward error correction (FEC) source block. The forward error correction (FEC) source block possibly comprises a subset of symbols of the at least two datastreams (see FIGS. 3 to 5). The FEC data symbol is also referred to as "repair symbol" in some sections of the description and in some claims, because from a decoder's perspective, the "repair symbols" can be used to repair (i.e., correct transmission errors using FEC) in one of more symbols of payload data streams.

The FEC data generator 644 comprises a signaling information generator configured to generate signaling information for the forward error correction data symbol. The signaling information indicates which symbols belong to the FEC source block that corresponds to the contemplated FEC data symbol. The FEC data generator 644 may decide which (payload) symbols in the datastreams for the base layer and for the enhancement layer shall be grouped together in order to form a given FEC source block. This decision of the FEC data generator may be based on a time relationship between the symbols that are concerned, so that for example all symbols in the base and enhancement layer datastreams that are supposed to be presented during a certain time interval (as defined by, e.g., the "presentation time stamp") are included in a certain FEC source block. As shown in FIGS. 3 to 5, a FEC source block typically considers one temporally coherent succession of symbols in a datastream, that is, there is no overlap or interlacing of two or more FEC source blocks within a datastream. This property makes it possible to keep the signaling for a given FEC data symbol relatively short and simple, because it is sufficient to notify the first symbol of the succession of considered source symbols, and the number of symbols (i.e., the length of the succession).

In particular, the signaling information generator may be configured, according to some embodiments, to generate the signaling information by:
  determining a pointer to a start symbol within a first datastream of the at least two datastreams
  determining a pointer to a start symbol within a second datastream of the at least two datastreams
  determining a number of symbols within the first datastream, which symbols belong to the corresponding FEC source block
  determining a number of symbols within the second datastream, which symbols belong to the corresponding FEC source block.

The signaling information may be included in the corresponding FEC data symbol (repair symbol), or the signaling information may be linked to the corresponding FEC data symbol (repair symbol) and transmitted to a decoder, e.g., via a different datastream. The FEC data symbols produced by the FEC data generator 644 form a repair stream for the enhancement and base layers.

Figure 7:
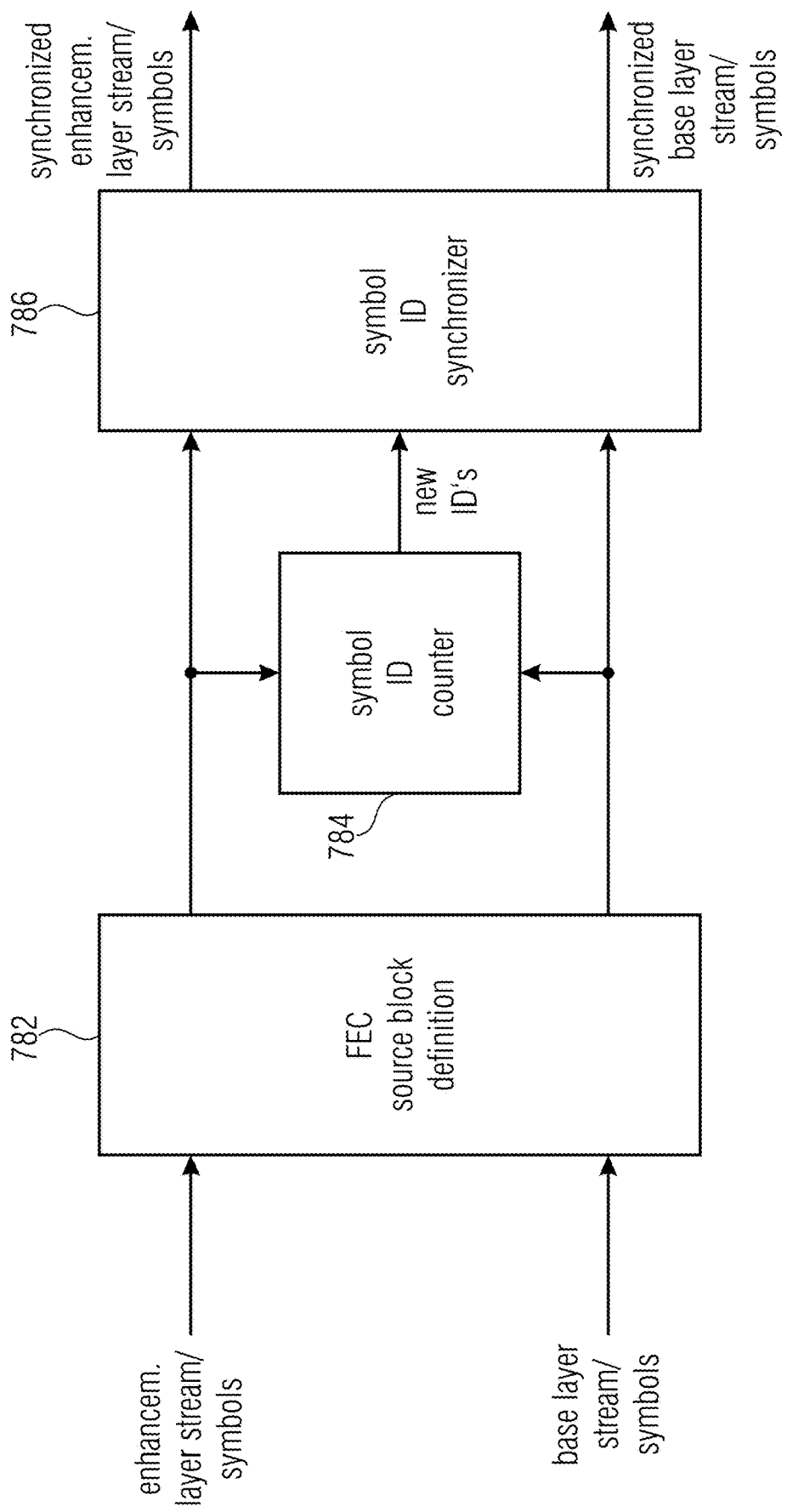
FIG. 7 shows a schematic block diagram of a portion of an FEC data generator.

FIG. 7 shows a schematic block diagram of a portion of an FEC data generator. The illustrated symbol ID counter determines a maximum number of symbols per datastream and FEC source block. When passing on to a subsequent FEC source block, a current counter value is incremented by the determined number.

The FEC data generator schematically illustrated in FIG. 7 comprises a FEC source block definition 782, the already mentioned symbol ID counter 784, and a symbol ID synchronizer 786.

The FEC source block definition 782 is configured to receive the base layer stream comprising a plurality of base layer symbols. The FEC source block definition is further configured to receive the enhancement layer stream(s), which comprise(s) a plurality of enhancement layer symbols. The FEC source block definition 782 is further configured to form a FEC source block by grouping specific symbols of the base layer and the enhancement layer(s). In other words, the FEC source block definition 782 is configured to decide which symbols of the base layer and the enhancement layer shall be used for forming a particular FEC source block. The selection of the symbols may be based on various criteria, for example temporal relations of the symbols.

The symbol ID counter 784 is configured to maintain the current counter value which is a common counter value. In particular, the common counter is updated by determining the number of symbols that each datastream (base stream and enhancement stream(s)) contributes to the current FEC source block. The highest number of symbols among the various datastreams determines the value by which the common counter is incremented. For example, assume that the base layer stream contributes six (6) symbols to the current FEC source block, and the enhancement layer stream contributes eleven (11) symbols to the same FEC source block; then the increment value for the common counter is eleven (11). Accordingly, the difference between the symbol IDs for the symbols starting the current FEC source block and the subsequent FEC source block is eleven. The symbol ID synchronizer 786 modifies the symbol IDs based on the information received from the symbol ID counter 784. Accordingly, the symbol ID synchronizer 786 outputs synchronized base layer and enhancement layer data streams, which means that each new FEC source block starts with a common symbol ID that is equal over all datastreams contributing to the FEC source block. Note that the symbol IDs within a single datastream might not be consecutive/continuous anymore, but might exhibit jumps or gaps at the boundary of two FEC source blocks. The occurrence of these jumps or gaps does typically not fundamentally alter the functionality of the FEC in particular and of the data transmission scheme in general.

In the foregoing description, methods have been proposed for associating repair symbols to source symbols of multiple flows for reconstruction of a FEC source block. A first possible method (schematically illustrated in FIG. 3, for example, and corresponding description) uses a pointer and a length to the associated source flow. A second possible method (schematically illustrated in FIG. 4, for example, and corresponding description) uses synchronization points as starting SI in all source flows. With the second method, a FEC source block for LA-FEC can be reconstructed with signaling the number of source symbols in the underlying layer while with the first mentioned method this additionally necessitates to indicate the starting SI in the underlying layer.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A forward error correction data generator comprising an electronic circuit, a processor or a computer and comprising:
   an input interface that receives a first datastream for a base layer and a second datastream for an enhancement layer for which forward error correction data shall be generated;
   wherein each of the first datastream and the second datastream comprises a sequence of symbols; and
   wherein the electronic circuit or processor is configured to, or the computer is programmed to:
     identify symbols in the first datastream and the second datastream by symbol identifiers (IDs) determined by use of a counter, wherein the symbols of the first datastream and the second datastream are grouped together in order to form forward error correction (FEC) source blocks,
     increment the counter within each FEC source block per symbol which belongs to a respective FEC source block and belongs to one datastream out of the first and second datastreams, which comprises a highest number of symbols within the respective FEC source block, so that,
     for each FEC source block, a first symbol in the first datastream within the respective FEC source block and a first symbol in the second datastream within the respective FEC source block are identified by a common symbol ID, and
     for each of the first and second datastreams, the common symbol ID of a first symbol within a predetermined FEC source block differs by a maximum of the number of symbols of the first datastream within the predetermined FEC source block and the number of symbols of the second datastream within the predetermined FEC source block from the common symbol ID of a first symbol within a subsequent FEC source block, and use Layer-Aware Forward Error Correction (LA-FEC) so as to generate a repair symbol based on the predetermined FEC source block, wherein the LA-FEC is applied to generate an FEC parity block for the base layer and another FEC parity block for the enhancement layer;

generate signaling information for the repair symbol by:
- determining a pointer to a start symbol within the first datastream,
- determining a pointer to a start symbol within the second datastream,
- determining a number of symbols within the first datastream that belong to the predetermined FEC source block, and
- determining a number of symbols within the second datastream that belong to the predetermined FEC source block; and the signaling information indicates symbols within the first datastream and the second datastream, which belong to the predetermined FEC source block, in a manner so that the signaling information is included into the repair symbol or linked therewith and provide the signaling information with:
- the common symbol ID of the predetermined FEC source block which identifies the first symbol in the first datastream within the predetermined FEC source block and the first symbol in the second datastream within the predetermined FEC source block,
- a first length information indicating a number of symbols within the first datastream, starting with the first symbol within the predetermined FEC source block, that belong to the predetermined FEC source block, and
- a second length information for a number of symbols within the second datastream, starting with the first symbol within the predetermined FEC source block, that belong to the predetermined FEC source block.

2. A forward error correction decoder comprising:

an input interface that receives a repair stream comprising repair symbols relative to a first datastream for a base layer and a second datastream for an enhancement layer to be forward error corrected, wherein each of the first datastream and the second datastream comprises a sequence of symbols which are identified by symbol identifiers (IDs) determined by a counter, wherein the symbols of the first datastream and the second datastream are grouped together in order to form forward error correction (FEC) source blocks, wherein the counter is incremented within each FEC source block per symbol which belongs to a respective FEC source block and belongs to one datastream out of the first and second datastreams, which comprises a highest number of symbols within the respective FEC source block, so that,
- for each FEC source block, a first symbol in the first datastream within the respective FEC source block and a first symbol in the second datastream within the respective FEC source block are identified by a common symbol ID, and
- for each of the first and second datastreams, the common symbol ID of a first symbol within a predetermined FEC source block differs by a maximum of the number of symbols of the first datastream within the predetermined FEC source block and the number of symbols of the second datastream within the predetermined FEC source block from the common symbol ID of a first symbol within a subsequent FEC source block, and wherein the forward error correction decoder comprises an electronic circuit or a processor configured to, or a computer programmed to, analyze a signaling information within a repair symbol or linked therewith, the signaling information including:
- a pointer to a start symbol within the first datastream,
- a pointer to a start symbol within the second datastream,
- a number of symbols within the first datastream that belong to the predetermined FEC source block,
- a number of symbols within the second datastream that belong to the predetermined FEC source block,
- the common symbol ID of the predetermined FEC source block which identifies the first symbol in the first datastream within the predetermined FEC source block and the first symbol in the second datastream within the predetermined FEC source block,
- a first length information indicating a number of symbols within the first datastream, starting with the first symbol within the predetermined FEC source block, that belong to the predetermined FEC source block, and
- a second length information for a number of symbols within the second datastream, starting with the first symbol within the predetermined FEC source block, that belong to the predetermined FEC source block, and wherein the electronic circuit or the processor is further configured to, or the computer is further programmed to, collect symbols within the first datastream and the second datastream belonging to the predetermined FEC source block using the signaling information.

3. A method for generating forward error correction data, the method comprising:

receiving a first datastream for a base layer and a second datastream for an enhancement layer for which forward error correction data shall be generated, wherein each of the first datastream and the second datastream comprises a sequence of symbols; and identifying symbols in the first datastream and the second datastream by symbol identifiers (IDs) determined by use of a counter, wherein the symbols in the first datastream and the second datastream are grouped together in order to form forward error correction (FEC) source blocks, incrementing the counter within each FEC source block per symbol which belongs to a respective FEC source block and belongs to one datastream out of the first and second datastreams, which comprises a highest number of symbols within the respective FEC source block, so that,
- for each FEC source block, a first symbol in the first datastream within the respective FEC source block and a first symbol in the second datastream within the respective FEC source block are identified by a common symbol ID, and for each of the first and second datastreams, the common symbol ID of a first symbol within a predetermined FEC source block differs by a maximum of the number of symbols of the first datastream within the predetermined FEC source block and the number of symbols of the second datastream within the predetermined FEC source block from the common symbol ID of a first symbol within a subsequent FEC source block, and by use of Layer-Aware Forward Error Correction (LA-FEC), generating a repair symbol based on the predetermined FEC source block, wherein the LA-FEC is applied to generate an FEC parity block for the base layer and another FEC parity block for the enhancement layer;

generating signaling information for the repair symbol by:
  determining a pointer to a start symbol within the first datastream,
  determining a pointer to a start symbol within the second datastream,
  determining a number of symbols within the first datastream that belong to the predetermined FEC source block, and
  determining a number of symbols within the second datastream that belong to the predetermined FEC source block; and the signaling information indicates symbols within the first datastream and the second datastream, which belong to the predetermined FEC source block, in a manner so that the signaling information is included into the repair symbol or linked therewith and provide the signaling information with:
  the common symbol ID of the predetermined FEC source block which identifies the first symbol in the first datastream within the predetermined FEC source block and the first symbol in the second datastream within the predetermined FEC source block,
  a first length information indicating a number of symbols within the first datastream, starting with the first symbol within the predetermined FEC source block, that belong to the predetermined FEC source block, and
  a second length information for a number of symbols within the second datastream, starting with the first symbol within the predetermined FEC source block, that belong to the predetermined FEC source block.

4. A method for forward error correction decoding, the method comprising:
  receiving a repair stream comprising repair symbols relative to a first datastream for a base layer and a second datastream for an enhancement layer to be forward error corrected, wherein each of the first datastream and the second datastream comprises a sequence of symbols which are identified by symbol identifiers (IDs) determined by a counter, wherein the symbols in the first datastream and the second datastream are grouped together in order to form forward error correction (FEC) source blocks, wherein the counter is incremented within each FEC source block per symbol which belongs to a respective FEC source block and belongs to one datastream out of the first and second datastreams, which comprises a highest number of symbols within the respective FEC source block, so that,
    for each FEC source block, a first symbol in the first datastream within the respective FEC source block and a first symbol in the second datastream within the respective FEC source block are identified by a common symbol ID, and
    for each of the first and second datastreams, the common symbol ID of a first symbol within a predetermined FEC source block differs by a maximum of the number of symbols of the first datastream within the predetermined FEC source block and the number of symbols of the second datastream within the predetermined FEC source block from the common symbol ID of a first symbol within a subsequent FEC source block, and
  analyzing a signaling information within a repair symbol or linked therewith, the signaling information including:
    a pointer to a start symbol within the first datastream,
    a pointer to a start symbol within the second datastream,
    a number of symbols within the first datastream that belong to the predetermined FEC source block,
    a number of symbols within the second datastream that belong to the predetermined FEC source block,
    the common symbol ID of the predetermined FEC source block which identifies the first symbol within the predetermined FEC source block of the first datastream and the first symbol within the predetermined FEC source block of the second datastream,
    a first length information indicating a number of symbols within the first datastream, starting with the first symbol within the predetermined FEC source block, that belong to the predetermined FEC source block, and
    a second length information for a number of symbols within the second datastream, starting with the first symbol within the predetermined FEC source block, that belong to the predetermined FEC source block, and
  collecting symbols within the first datastream and the second datastream belonging to the predetermined FEC source block using the signaling information.

5. A non-transitory computer-readable storage medium storing a computer program for implementing a method for generating forward error correction data according to claim 3 when being executed on a computer or signal processor.

6. A non-transitory computer-readable storage medium storing a computer program for implementing a method for forward error correction decoding according to claim 4 when being executed on a computer or signal processor.

* * * * *